(12) United States Patent
Paulauskas et al.

(10) Patent No.: US 9,340,677 B2
(45) Date of Patent: May 17, 2016

(54) APPARATUS AND PROCESS FOR THE SURFACE TREATMENT OF CARBON FIBERS

(71) Applicant: UT-Battelle, LLC, Oak Ridge, TN (US)

(72) Inventors: Felix Leonard Paulauskas, Knoxville, TN (US); Soydan Ozcan, Oak Ridge, TN (US); Amit K. Naskar, Knoxville, TN (US)

(73) Assignee: UT-BATTELLE, LLC, Oak Ridge, TN (US)

( * ) Notice: Subject to any disclaimer, the term of this patent is extended or adjusted under 35 U.S.C. 154(b) by 0 days.

(21) Appl. No.: 14/247,601

(22) Filed: Apr. 8, 2014

(65) Prior Publication Data

US 2014/0220248 A1    Aug. 7, 2014

Related U.S. Application Data

(62) Division of application No. 13/363,711, filed on Feb. 1, 2012.

(51) Int. Cl.
| | | |
|---|---|---|
| *C23C 16/00* | (2006.01) | |
| *C09C 1/56* | (2006.01) | |
| *C23C 16/40* | (2006.01) | |

(Continued)

(52) U.S. Cl.
CPC ................ *C09C 1/565* (2013.01); *C08J 5/042* (2013.01); *C08J 5/06* (2013.01); *C08J 5/24* (2013.01); *C23C 16/40* (2013.01); *C23C 16/455* (2013.01); *D06M 11/34* (2013.01); *C01P 2002/85* (2013.01); *C08J 2363/00* (2013.01); *C08J 2367/06* (2013.01); *C08K 3/04* (2013.01); *D06M 2101/40* (2013.01); *Y10T 428/2918* (2015.01);

(Continued)

(58) Field of Classification Search
CPC .............................. C23C 16/40; C23C 16/455
See application file for complete search history.

(56) References Cited

U.S. PATENT DOCUMENTS

| | | | |
|---|---|---|---|
| 3,671,285 A | 6/1972 | Prescott | |
| 3,671,411 A | 6/1972 | Ray et al. | |

(Continued)

FOREIGN PATENT DOCUMENTS

| | | |
|---|---|---|
| CN | 1082131 A | 2/1994 |
| JP | 7-185336 | 7/1995 |

(Continued)

OTHER PUBLICATIONS

Machin translation of JP 2000-154460.*

(Continued)

*Primary Examiner* — Elizabeth Burkhart
(74) *Attorney, Agent, or Firm* — Scully, Scott, Murphy & Presser, P.C.

(57) ABSTRACT

A method for surface treating a carbon-containing material in which carbon-containing material is reacted with decomposing ozone in a reactor (e.g., a hollow tube reactor), wherein a concentration of ozone is maintained throughout the reactor by appropriate selection of at least processing temperature, gas stream flow rate, reactor dimensions, ozone concentration entering the reactor, and position of one or more ozone inlets (ports) in the reactor, wherein the method produces a surface-oxidized carbon or carbon-containing material, preferably having a surface atomic oxygen content of at least 15%. The resulting surface-oxidized carbon material and solid composites made therefrom are also described.

16 Claims, 5 Drawing Sheets

(51) Int. Cl.
*C23C 16/455* (2006.01)
*C08J 5/04* (2006.01)
*D06M 11/34* (2006.01)
*C08J 5/06* (2006.01)
*C08J 5/24* (2006.01)
*D06M 101/40* (2006.01)
*C08K 3/04* (2006.01)

(52) U.S. Cl.
CPC .......... *Y10T 428/2991* (2015.01); *Y10T 428/30* (2015.01); *Y10T 442/20* (2015.04)

(56) References Cited

U.S. PATENT DOCUMENTS

| | | | |
|---|---|---|---|
| 3,723,150 | A | 3/1973 | Druin et al. |
| 3,832,297 | A | 8/1974 | Paul, Jr. |
| 3,859,187 | A | 1/1975 | Druin et al. |
| 4,050,997 | A | 9/1977 | Heissler et al. |
| 4,130,465 | A | 12/1978 | Arai et al. |
| 4,990,285 | A | 2/1991 | Lehijani |
| 5,908,652 | A | 6/1999 | Sakano |
| 5,997,613 | A * | 12/1999 | Kaneko et al. .................. 95/126 |
| 6,013,730 | A | 1/2000 | McGrail et al. |
| 6,648,973 | B2 | 11/2003 | Drzal et al. |
| 6,649,225 | B2 * | 11/2003 | Drzal et al. .................. 427/595 |
| 6,969,503 | B2 | 11/2005 | Yanagisawa et al. |
| 7,649,078 | B1 * | 1/2010 | Paulauskas ............. B29C 59/14 264/176.1 |
| 7,749,479 | B2 * | 7/2010 | Leon y Leon .............. 423/447.2 |
| 7,824,495 | B1 * | 11/2010 | White et al. .................. 118/718 |
| 2009/0093582 | A1 | 4/2009 | Zhang et al. |
| 2009/0176112 | A1 | 7/2009 | Kruckenberg et al. |
| 2010/0068518 | A1 | 3/2010 | Honma et al. |
| 2013/0196155 | A1 | 8/2013 | Paulauskas et al. |

FOREIGN PATENT DOCUMENTS

| | | |
|---|---|---|
| JP | 2000-154460 * | 6/2000 |
| WO | WO 2009/129936 A1 | 10/2009 |

OTHER PUBLICATIONS

U.S. Office Action dated Dec. 16, 2014 in U.S. Appl. No. 13/363,711.
Plee et al., WO 2010/066989 A1, "Method for Manufacturing a Sno2 Composite Material and Carbon Nanotubes and/or Carbon Nanofibers, Material Obtained by the Method, and Lithium Battery Electrode Comprising Said Material" (Jun. 17, 2010).
Final Office Action dated Jul. 25, 2014 in related U.S. Appl. No. 13/363,711.

* cited by examiner

APPARATUS AND PROCESS FOR THE SURFACE TREATMENT OF CARBON FIBERS

CROSS REFERENCE TO RELATED APPLICATIONS

This application is a divisional of U.S. application Ser. No. 13/363,711 filed on Feb. 1, 2012, the contents of which are incorporated herein by reference in their entirety.

This invention was made with government support under Prime Contract No. DE-AC$_{05}$-00OR22725 awarded by the U.S. Department of Energy. The government has certain rights in the invention.

FIELD OF THE INVENTION

The present invention relates, generally, to the manufacture and surface treatment of carbon fibers, and their composite materials.

BACKGROUND OF THE INVENTION

Carbon fiber reinforced polymer composites are known for their outstanding mechanical properties with a low density. Some of their outstanding mechanical properties include superior shear properties and impact resistance. For this reason, they have been of interest to many fields, particularly for rugged applications, such as the space and aeronautics industries, military equipment, transportation, and infrastructure.

However, a key deficiency in these composite materials has been an insufficient adhesion of the carbon fibers to the polymer matrix. In turn, the low adhesion has a detrimental effect on the mechanical properties, usable lifetime, and integrity of such composites. Although several methodologies, including electrolytic (i.e., electrochemical) treatments or the use of various sizing agents on the carbon fiber, have been investigated in attempting to improve the surface characteristics of carbon fibers, they have been largely inefficient for achieving the desired end, or impractical from a cost or processing standpoint.

Electrochemical treatment of carbon fiber is commonly used in the art, as described, for example, in U.S. Pat. Nos. 3,671,411, 3,832,297, 3,859,187, and 4,050,997. In a typical electrochemical treatment process, carbon fiber is passed through a conductive solution while current is applied to the fiber. However, electrochemical treatment has several drawbacks. In particular, the electrolytic solution used in the electrochemical treatment generally requires a significant degree of maintenance, i.e., checking and controlling the levels of electrolyte and other species, filtering away debris, and recirculation. Eventually, the electrolytic medium will become spent, at which point it is typically discarded and replaced with new electrolytic liquid, all of which results in increased cost and possible detriment to the environment.

Another significant disadvantage of the electrochemical process is its general reliance on a network of rollers that guide the fiber tow or fabric in a serpentine path through the electrolyte. Moreover, once the bundle of filaments exits the electrolyte bath, the filaments are typically passed through a nip roller that squeezes out residual liquid from the fiber. Particularly for high modulus carbon fiber that possesses a degree of brittleness or low elasticity (as is typical for carbon fibers that have been graphitized), the bending and squeezing mechanical action of the rollers subjects the carbon fiber to an excessive level of stress and strain that ultimately causes damage to the carbon fiber.

SUMMARY OF THE INVENTION

The present invention is foremost directed to a process for the surface treatment of carbon-containing fiber or other shaped object by gas phase oxidation. The process can, for example, improve the adhesion of the fiber to a polymeric matrix in the manufacture of carbon fiber-reinforced composite materials. The method accomplishes this by significantly increasing the surface atomic oxygen content by oxidative treatment on the carbon-containing object, wherein surface atomic oxygen content is proportional to the level of oxygen-containing surface functional groups. The increased level of surface functional groups generally leads to an increased favorable interaction and/or covalent bonding between the carbon-containing objects and polymer matrix in the resulting composites, and thereby, results in significantly improved mechanical properties in the composites. Indeed, the thermochemical method described herein is capable of providing a carbon-containing material with twice or more atomic oxygen content on its surface as compared to a carbon-containing material treated by traditional electrochemical surface treatment.

Moreover, the method described herein circumvents many of the costly and environmentally detrimental shortcomings inherent in electrochemical treatment methods. In particular, as the method described herein is a gas phase oxidation method, the method advantageously dispenses with passing fiber tow or fabric through rollers customarily used in electrochemical treatment processes. Therefore, the method described herein provides the significant advantage of providing a highly effective surface treatment of carbon fiber or fabric while circumventing the significant mechanical damage typically associated with the electrochemical process. Thus, by virtue of the low-stress conditions employed in the gas-based method described herein, the method can advantageously produce a surface-treated high modulus carbon fiber that is not damaged and substantially free of defects.

More specifically, the method involves reacting a carbon-containing material (e.g., carbon fiber, fiber tow, film, or woven or non-woven mat or mesh) in a flowing gas stream containing ozone under conditions in which the ozone decomposes in a controlled manner and a concentration of ozone is maintained throughout the chamber in which the carbon-containing material is being processed. In this way, the method permits all portions of the carbon-containing material held in the treatment apparatus to make contact with reactive ozone decomposition products. Conversely, the method prevents the situation where ozone decomposition products substantially degrade before they have a chance to make contact with the carbon-containing material.

The foregoing methodology is a significant improvement over the art in which portions of a carbon fiber further away from an ozone inlet receive significantly less or no treatment with ozone compared to portions of the carbon fiber near the outlet. The resulting carbon fiber of the art possesses an overall low surface atomic oxygen content, typically no more than about 10%. In contrast, the instant method provides a much higher surface atomic oxygen content on a carbon-containing object, generally at least 15%, 18%, or 20% surface atomic oxygen content. The method described herein can also advantageously eliminate washing and drying steps traditionally used in industrial electrochemical treatment processes. Dispensing of these and other steps significantly reduces processing costs.

The invention advantageously provides an improved or optimal ozone degradation profile inside a reactor or insert in which all or substantially all of the injected ozone is thermally decomposed and directly interacting with the surface of the material during the treatment. The improved ozone degradation profile advantageously permits the concentration of ozone at both the entrance and exit of the reactor or insert to be near zero or negligible. Moreover, the process described herein is highly efficient by using all or substantially all of the ozone charged into the reactor or insert.

In more specific embodiments, the method includes reacting a carbon-containing material with decomposing ozone by passing the carbon-containing material through a hollow tube or other shaped chamber (i.e., processing reactor or insert) containing a flowing gas stream containing ozone under conditions where the ozone decomposes after being introduced into the hollow tube or other shaped chamber by at least one ozone inlet, wherein a concentration of the ozone is maintained throughout the hollow tube or other shaped chamber by appropriate selection of at least processing temperature, gas stream flow rate, reactor dimensions (e.g., tube diameter and tube length), ozone concentration entering the reactor, and position of the one or more ozone inlets in the reactor. Moreover, in the instant method, in order to maximize the lifetime of reactive ozone decomposition products, the gas stream preferably does not contact a metal surface during the surface treatment, e.g., metal can be excluded from inner portions of the chamber that would make contact with the gas stream.

In another aspect, the invention is directed to the carbon-containing material resulting from the above-described treatment process, i.e., the processed (or surface-oxidized) carbon-containing material. In particular embodiments, the processed carbon-containing fiber is further functionalized with a sizing agent, such as an epoxy sizing agent. The high density of oxygen-containing groups on the processed carbon-containing fiber permits a much greater bonding of the sizing agent with the carbon fiber surface.

In yet another aspect, the invention is directed to a solid composite in which processed carbon-containing fibers, produced by the above ozonation method, are incorporated into a polymeric matrix. The polymeric matrix can be a thermoset or thermoplastic polymer, such as a polymer derived from an epoxy resin, vinyl ester resin, or unsaturated polyester resin. The invention is also directed to a device or apparatus that contains the composite, such as a protective or impact-resistant layer, coating, or film, or an interior or exterior siding or surface of a structure, such as an automobile, aircraft, or building, or a tool or appliance, particularly where a lightweight high-strength material is desired.

DETAILED DESCRIPTION OF THE INVENTION

Figure 1:
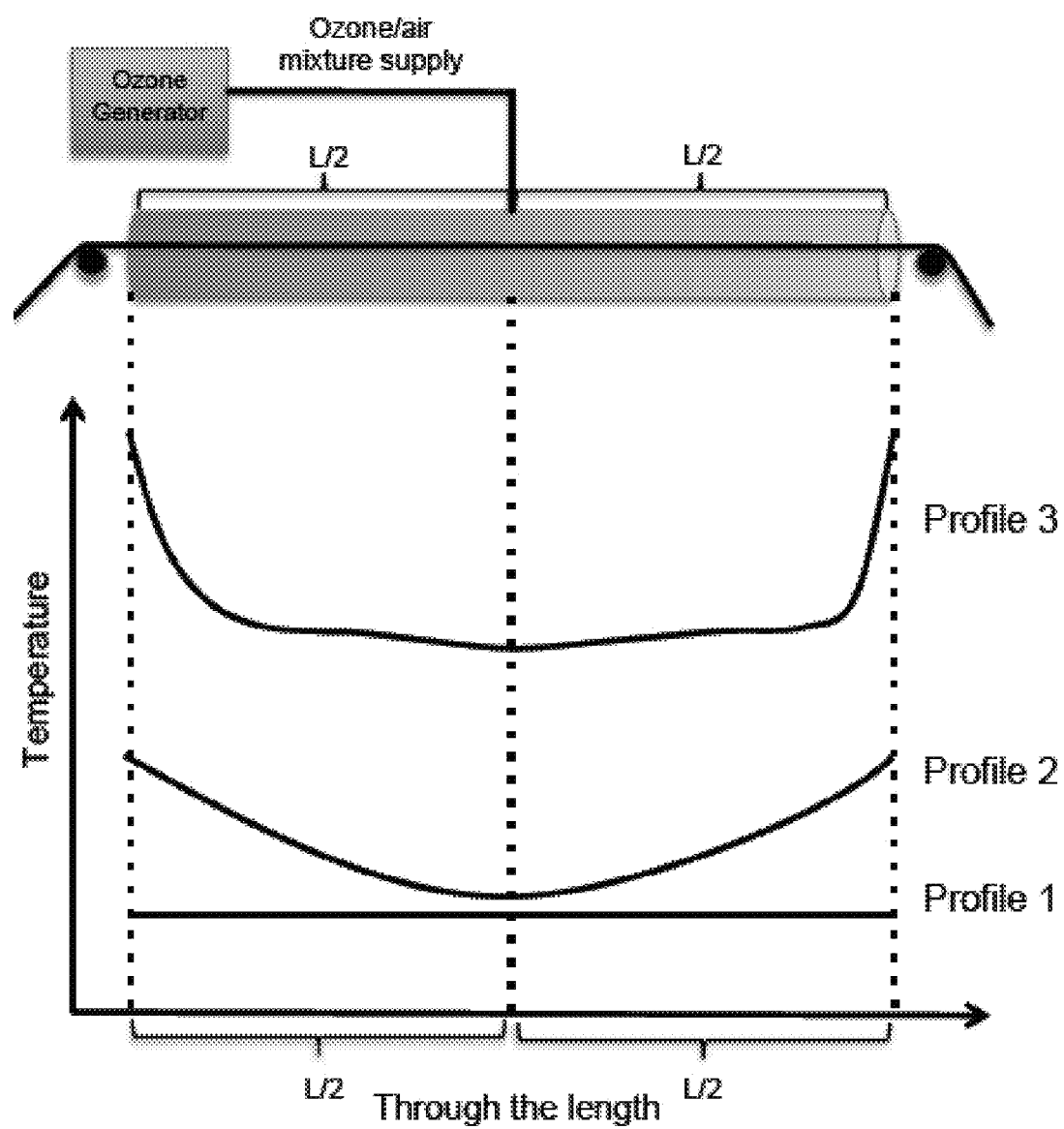
FIG. 1. General schematic showing an exemplary continuous ozone treatment apparatus and process according to the instant invention. Indicated are different versions of the apparatus. Also indicated are different typical temperature profiles, but not limited thereto.

The carbon-containing material used as a starting material (i.e., substrate) in the ozonation method described herein is any solid object constructed substantially of carbon, whether in elemental or compound form. The amount of carbon in the object is typically at least 20% by weight of the object. In different embodiments, the substrate contains carbon in an amount of at least 20%, 30%, 40%, 50%, 60%, 70%, 80%, or 90% by weight of the object.

In particular embodiments, the carbon-containing material used as a starting material in the ozonation method described herein is any object constructed substantially of elemental carbon, generally at least 85%, 90%, 95%, 98%, or 99% elemental carbon, or completely (100%) carbon. An element other than carbon is generally included in a dopant amount (e.g., up to or less than 10,000, 5,000, 1,000, 500, or 100 ppm). The element other than carbon can be, for example, nitrogen, boron, oxygen, sulfur, or phosphorus, or a combination thereof.

In some embodiments, the substrate is a carbon-containing (i.e., carbonaceous) polymeric material that can contain any of the heteroatoms described above in any suitable amount that maintains a substantial amount of carbon in the substrate. The carbonaceous polymeric material can be, for example, a polyolefin (e.g., polyethylene or polypropylene), a polyacrylate or polymethacrylate, a polyester, a polyamide, phenol-formaldehyde, or polyurethane.

The carbon-containing object to be treated can be in the form of, for example, a fiber, whisker, fiber tow, a woven or non-woven mat of fiber, block (e.g., graphite or polymeric block), film (e.g., graphite film), sheet, rod, tube, particles, or powder. Generally, the carbon-containing object considered herein, including carbon particles, are macroscopic in size, e.g., at least 100, 250, or 500 microns or 1 mm in size in at least one, two, or all of its dimensions. In the case of carbon fiber or whisker, as known in the art, these have a length dimension longer than a width dimension, and typically can have widths of about or at least 100, 200, 250, 300, 400, 500, 1000, 1500, 2000, 2500, or 3000 microns and lengths ranging from millimeters to meters. Carbon fiber tows may have the same or a greater thickness depending on the thickness of the individual fibers in the tow.

In particular embodiments, the carbon-containing substrate is any of the high-strength carbon fiber compositions known in the art. Some examples of carbon fiber compositions include those produced by the pyrolysis of polyacrylonitrile (PAN), viscose, rayon, lignin, pitch, polyolefin, as well as single-walled and multi-walled carbon nanotubes, any of which may or may not be heteroatom-doped, such as with nitrogen, boron, oxygen, sulfur, or phosphorus. The carbon fiber considered herein generally possesses a high tensile strength, such as at least 500, 1000, 2000, 3000, 5000, or 10,000 MPa, with a degree of stiffness generally of the order of steel or higher (e.g., 100-1000 GPa). The carbon fiber (or tow, mat, or fabric) being treated may also have any elastic modulus (i.e., modulus) known in the art. The invention is particularly directed to treating a high modulus or ultra-high modulus carbon fiber, which can be herein considered to have an elastic modulus of at least 50 Mpsi or 100 Mpsi, respectively. However, in different embodiments, the carbon or carbon-containing fiber being treated can have an elastic modulus of precisely, about, at least, or up to, for example, 5, 10, 20, 30, 40, 50, 60, 70, 80, 90, 100, 110, 120, 130, 140, or 150 Mpsi, or an elastic modulus within a range bounded by any two of these values. The surface-treated material may also have any suitable tensile strength and elastic modulus, such as any of the exemplary tensile strengths and elastic moduli provided above.

As used herein, the term "about" generally indicates within ±0.5%, 1%, 2%, 5%, or up to ±10% of the indicated value. For example, a size of about 100 microns generally indicates, in its broadest sense, 100 microns±10%, which indicates 90-110 microns. In addition, the term "about" can indicate either a measurement error (i.e., by limitations in the measurement method), or alternatively, a variation or average in a physical characteristic of a group (e.g., a range of sizes).

In the method, a carbon-containing material is placed in a processing chamber in which ozone ($O_3$) is introduced by one, two, three, or a higher number of inlets. The processing chamber is typically elongated, such as a hollow tube, square, rectangle, or other shaped channel, in order to permit the carbon-containing material to be passed through, particularly in the case of a long carbon fiber, rod, or tube that cannot fit in its entirety in the chamber. However, the processing chamber can be any suitable shape or size (e.g., rectangular or spherical) that permits a carbon-containing material to be processed by the method described herein. In some embodiments, the carbon-containing material is rotated, agitated, sonicated, or tumbled during the process, whereas in other embodiments the carbon-containing material is substantially still. Generally, in order to permit the flow of ozone and carrier gas, at least one outlet is also included in the reactor.

The method employs a set of conditions in which a concentration of ozone is maintained throughout the reactor and the ozone thermally decomposes to produce reactive decomposition products that oxygenate the surface of the carbon-containing object. One such highly reactive decomposition product is monoatomic oxygen (O). The thermal decomposition of ozone can be conveniently expressed by the following equations:

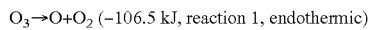
$$O_3 \rightarrow O + O_2 \text{ (−106.5 kJ, reaction 1, endothermic)}$$

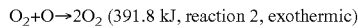
$$O_2 + O \rightarrow 2O_2 \text{ (391.8 kJ, reaction 2, exothermic)}$$

The overall reaction is exothermic with a net value of about 285.3 kJ/mol.

The concentration of ozone at the location in the processing chamber where ozone enters is herein designated as a 100% ozone level. The actual concentration of ozone at which ozone enters (i.e., before diffusing into the chamber) has no bearing on the "100% ozone" designation, and can be any suitable concentration. In different embodiments, the actual concentration of ozone at the inlet can be precisely, at least, up to, or less than, for example, 0.1, 0.2, 0.5, 1, 2, 3, 4, 5, 6, 7, 8, 9, 10, 11, 12, 15, 18, 20, 22, 25, or 30 wt % in a carrier gas, or within a range bounded by any two of the foregoing exemplary values. The initial (100%) level of ozone immediately begins decomposing by the elevated thermal conditions used in the method, thereby immediately depleting the ozone level. As known in the art, the depletion of ozone becomes more pronounced with distance from the ozone inlet.

According to known practice in the art, portions of the chamber (reactor or insert) displaced from the ozone inlet contain a meager concentration (e.g., less than 5% relative to 100% ozone level at inlet) or complete absence of ozone during the process, which results in portions of carbon-containing material in those regions of the reactor or insert receiving little or no ozone treatment. However, by the instant method, conditions are selected that maintain a significant concentration of ozone throughout the reactor or insert during processing of the carbon-containing material. The conditions include processing temperature, gas stream flow rate, reactor dimensions (or tube diameter and tube length), starting ozone concentration (i.e., at inlet), and positioning of the one or more ozone inlets in the chamber. By suitable adjustment of at least these conditions and residence time, the method achieves an effective concentration of ozone throughout the chamber, which is instrumental in achieving an improved oxygenation level of carbon-containing material of at least 5%, 10%, 15%, 18%, or 20%.

During the method, the concentration of ozone throughout the reactor or insert is preferably no less than 10%, 15%, or 20% relative to the starting ozone oncentration (i.e., taken as 100%) of ozone entering from the inlet. In different embodiments, the concentration of ozone throughout the reactor or insert is maintained at precisely, about, or at least 1%, 5%, 10%, 15%, 20%, 22%, 25%, 28%, 30%, 35%, 40%, 45%, 50%, 55%, 60%, 65%, 70%, or 75% relative to the starting ozone concentration at the one or more inlet ports, or a concentration of ozone within a range bounded by any two of the foregoing exemplary values. As can be appreciated, the higher the amount of ozone detected in a particular zone of the reactor or insert, the lower the amount of ozone decomposition products at that zone. Thus, there is an optimal balance between keeping a substantial level of ozone concentration throughout the reactor or insert while also providing an efficient production of ozone decomposition products. For example, a concentration of ozone throughout the reactor or insert of 80% or greater can be achieved, particularly at lower temperatures, but such high concentrations of ozone throughout the reactor or insert also result in inefficient oxygenation of the carbon fiber surface, and non-degraded ozone leaves the reactor or insert through the entrance and exit openings. Moreover, although the term "throughout the reactor" generally indicates 100% of the reactor or insert, in some embodiments, the term "throughout the reactor" may indicate a substantial portion of the reactor, such as 85%, 90%, 95%, 98%, or 99% of the reactor or insert, or of the length of a tubular reactor (i.e., a substantially minor volume of the reactor may, in some cases, have less than a 5%, 10%, 15%, or 20% ozone concentration).

The processing temperature is preferably at least 40° C. and up to 200° C. In different embodiments, the processing temperature is precisely or about, for example, 40° C., 45° C., 50° C., 55° C., 60° C., 65° C., 70° C., 75° C., 80° C., 85° C., 90° C., 95° C., 100° C., 105° C., 110° C., 115° C., 120° C., 125° C., 130° C., 135° C., 140° C., 145° C., 150° C., 155° C., 160° C., 165° C., 170° C., 175° C., 180° C., 185° C., 190° C., 195° C., or 200° C., or a processing temperature within a range bounded by any two of the foregoing exemplary values, such as 50-200° C., 75-200° C., 100-200° C., 120-200° C., 140-200° C., 50-190° C., 75-190° C., 100-190° C., 120-190° C., 140-190° C., 50-180° C., 75-180° C., 100-180° C., 120-180° C., 140-180° C., 50-160° C., 75-160° C., 100-160° C., 120-160° C., 130-160° C., 140-160° C., or 130-150° C.

As indicated in FIG. 1, different temperature profiles can be used in this process. The selection will depend on the process parameters used for achieving a high level of efficiency in the system. In some embodiments, a constant or substantially constant temperature is used throughout the reactor or insert (as indicated by "Profile 1" in FIG. 1). As used herein, the term "substantially constant" may be defined in accordance with the term "about," as discussed above, i.e., generally, a variation in temperature of no more than or less than 10, 5, 2, or 1%. In other embodiments, a substantially variant temperature is used in the reactor or insert, i.e., different parts of the reactor or insert may be set at different temperatures. For example, a sharp increase in the temperature profile at both ends of the reactor or insert (as indicated by "Profile 2" or "Profile 3" in FIG. 1) will, in some embodiments, assure a further decomposition of the ozone, and thus, minimal or no loss of ozone escaping the reactor or insert. Moreover, the temperature profiles do not need to be symmetrical to the center of the reactor or insert. For example, the temperature profile can rise at the center and at each end of the reactor.

Figure 5:
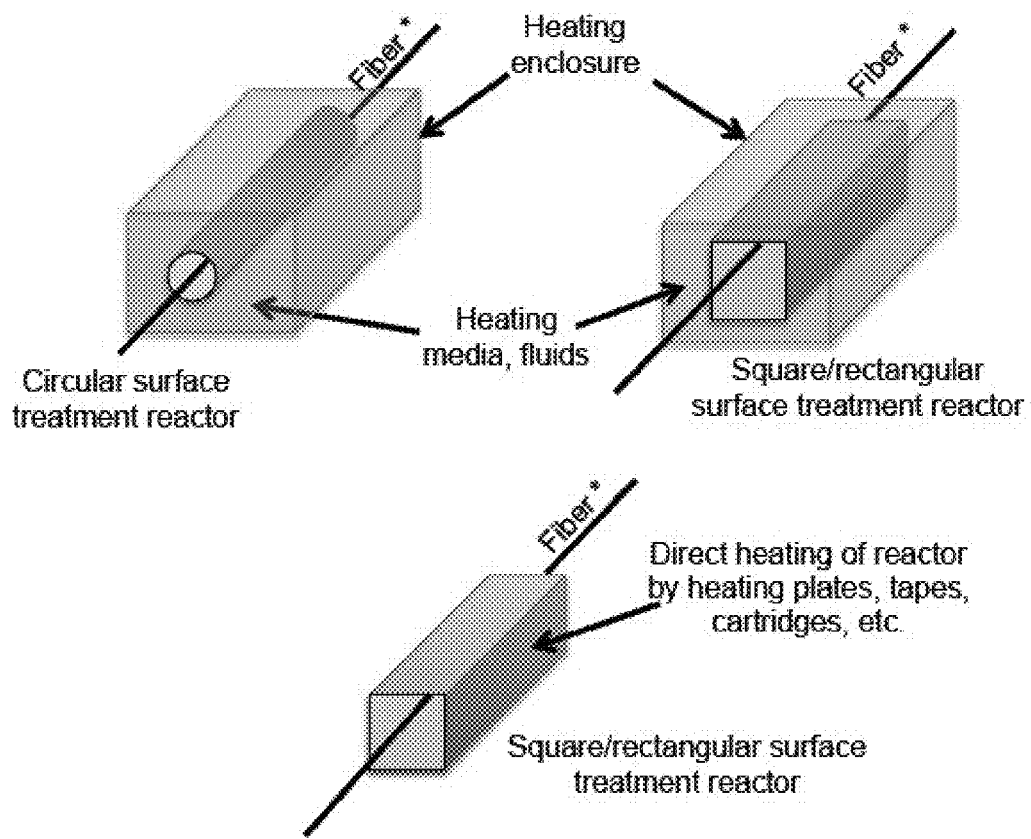
FIG. 5. General schematics showing some exemplary methodologies and apparatuses for heating an elongated reactor.

The reactor or insert can be heated by any suitable method and apparatus known in the art. The heating methodology employed is preferably capable of providing a wide range of temperature profiles along with the capability for careful and selective temperature adjustment. For example, the reactor or insert can be in a surrounded enclosure for thermal management purposes. In this case, a heating gas (e.g., air) or fluid is typically made to circulate between the outside wall of the reactor or insert and the inside wall of the enclosure. The enclosure can be constructed of any suitable material that is structurally stabile under the conditions used. In other embodiments, a heating element is applied directly on the reactor or insert wall. The heating element can be, for example, a heating plate, heating tape, heating film, or heating rod. Some of these exemplary heating methods and apparatuses used therefore are schematically depicted in FIG. 5.

The ozone-containing gas stream flow rate (i.e., "flow rate") is generally at least 0.5 liters/min (0.5 lt/min) and up to 10 liters/min, particularly for a typical lab-scale reactor. In different embodiments, the flow rate is precisely or about, for example, 0.5, 1.0, 1.5, 2.0, 2.5, 3.0, 3.5, 4.0, 4.5, 5.0, 5.5, 6.0, 6.5, 7.0, 7.5, 8.0, 9.0, 9.5, or 10 liters/min, or a flow rate within a range bounded by any two of the foregoing exemplary values. For industrial-scale reactors, the flow rate may be above 10 liters/min, such as 15, 20, 30, 50, 100, 500, 1000, or 10,000 liters/min. Generally, the gas stream flows in a particular direction for the duration of the process. However, the gas stream may also alternate in direction or be made to also flow in a direction at an angle (or normal) to the direction of the gas stream flow in order to promote a more even distribution of ozone throughout the carrier. The carrier gas in the gas stream can be any gas or mixture of gases that does not appreciably degrade or render non-reactive the reactive ozone decomposition products of ozone. The carrier gas can be, for example, an oxygen-containing gas or mixture of gases, such as air, oxygen-enriched air, or an oxygen-inert gas mixture, or the carrier gas can be or include, for example, an inert gas, such as nitrogen, helium, or argon.

Particularly when the above-described process is practiced in an industrial mode, the theoretical rate of reactor volume renewal is a key factor for maintaining a high level of ozone concentration inside the reactor or insert and for maintaining proper performance of the system. The theoretical rate of reactor volume renewal is a measure that indicates the time needed to replace the entire reactor volume at a specific supply flow rate that should be undertaken in an acceptable time lapse. For example, a reactor tube or insert having an inside diameter of three inches with an overall 60-inch tube length has a volume of 424 cubic inches. When the reactor or insert is supplied with a gas flow rate of 10 liter/min (610.2 cubic inches/min), the theoretical reactor volume renewal should occur in 0.695 min. However, the optimal theoretical rate of reactor volume renewal to achieve efficient surface treatment depends on process parameters such as supplied ozone concentration, temperature of reactor, reactor material, etc. For most practical purposes, the volume renewal time can be 0.01 to 60 minutes depending on, for example, flow rate of gas, temperature of reactor, ozone concentration in the supply gas, residence time of the substrate, and the temperature gradient inside the reactor. Typically, the reactor renewal time is in the range of 0.1 to 20 minutes.

In some embodiments, the substrate is processed in a continuous mode, as particularly applicable for treating a carbon-containing fiber, fiber tow, mat, or fabric. In a continuous processing mode, the substrate can be fed to the reactor at a line speed of, for example, 1 to 400 inches/minute. In other embodiments, the substrate is processed in a non-continuous mode, such as a semi-continuous or batch mode. For example, using the same reactor with tunable reactor volume renewal time, a powdery or particulate substrate (e.g., carbon black, nanotubes, nanoparticles, graphite powder, etc.), fiber spool, continuous fiber, or fabric can be surface-treated either in continuous mode (e.g., by use of a conveyer), semi-continuous mode, or batch mode. In a semi-continuous mode, a substrate is generally placed in the reactor and removed after a certain residence time while supply of the reacting gas is maintained in the reactor. In batch mode, the reactor is generally maintained with reactor gas and substrate for a desired residence time, and subsequently, the residual reactor gas or its decomposition products are removed and the surface-treated substrates are removed. The residence time of the substrate in the reactor is dependent on the processing mode used in the reactor. Depending on the substrate type, gas flow rate, temperature of the reactor, and ozone concentration in the supply gas, the residence time inside the reactor can typically vary from 0.01 to 60 minutes, more typically from 1 second to 10 minutes.

In particular embodiments, the reactor or insert in which carbon-containing material is processed is in the shape of a hollow tube. The tube is preferably circular, but can be another shape (e.g., square or other polygonal) as long as the shape does not obviate the goals of the method. The hollow tube shape is particularly suited for processing carbon fiber, since carbon fiber is typically too long to be processed all at once. Using the hollow tube processor, carbon fiber can be held in a wound form (e.g., as a tow on a creel), from which the tow is pulled through the tube at a desired speed. The latter process is particularly suited for a continuous process.

The tube or other shaped reactor or insert can be any suitable dimension that permits an effective concentration of ozone to reside in all parts of the reactor or insert. In particular embodiments, the reactor or insert is a tube having an internal diameter (ID) of at least 2.5 or 3 inches. In different embodiments, the internal diameter of the tube is precisely, about, or at least, for example, 2.5, 3, 3.5, 4, 4.5, 5, 5.5, or 6 inches. In different embodiments, the length of the tube is precisely, about, at least, up to, or less than, for example, 30, 40, 50, 60, 70, 80, 90, 100, 110, 120, 130, 140, 150, 160, 170, 180, 190, or 200 inches.

The location of the one or more ozone inlets can also affect the distribution of ozone within the reactor or insert. In the particular case of a hollow tube reactor or insert, a single inlet may be used, which can be positioned at, for example, 5, 10, 20, 30, 40, or 50% (the middle) of the total length from an end of the tube. In other embodiments, two, three, or four inlets may be used in tandem at any location of the tube, such as any of those positions exemplified above. When more than one inlet is used, two or more of the inlets may be positioned co-linearly along the length of the tube, or two or more of the inlets may be positioned non-colinearly, i.e., a certain distance apart and angularly displaced by any suitable angle, such as 30, 60, 90, 120, 150, or 180 degrees. Any number of outlets may be similarly positioned.

The reactor or insert is preferably constructed in its interior portions of materials that are non-reactive with ozone or its decomposition products. Since metals have, in general, been found to adversely react with ozone, the method described herein preferably excludes metals (generally in a zerovalent or metallic state) from any interior portions of the reactor or insert that could make contact with the gas stream. Some examples of such metals include aluminum, tin, and any of the transition metals (such as iron, nickel, cobalt, copper, zinc, and platinum), and their alloys. In preferred embodiments, at least the interior portion of the reactor or insert is constructed of a non-metallic glass or ceramic, such as any of the alumina or quartz reactor materials known in the art. However, in some embodiments, a metal can be used if the metal is sufficiently corrosion resistant. An example of a metal that is generally acceptably corrosion resistant is a high quality stainless steel, particularly grades 316 or 304, or a corrosion resistant alloy of the 300 series or A286, and other alloys with similar corrosion resistance.

The carbon-containing material can be processed for any suitable amount of time that can achieve a surface atomic oxygen content of at least 5%, 10%, 15%, 18%, or 20%, or higher surface atomic oxygen content. Depending on other reaction conditions, including starting ozone concentration and flow rate, the processing (residence) time can be, for example, at least 10 seconds and up to 10 minutes, which is the time the carbon-containing material is contacted with the ozone-containing gas stream. In different embodiments, the carbon-containing material is processed in the reactor or insert (i.e., contacted with the ozone-containing gas stream) for precisely, about, at least, up to, or less than, for example, 1 second, 10 seconds, 20 seconds, 30 seconds, 1 minute, 1.5 minutes, 2 minutes, 2.5 minutes, 3 minutes, 3.5 minutes, 4 minutes, 5 minutes, 6 minutes, 7 minutes, 8 minutes, 9 minutes, 10 minutes, 15 minutes, 20 minutes, 25 minutes, or 30 minutes, or a processing time within a range bounded by any two of the foregoing exemplary values. In the case of a carbon-containing fiber being processed in a hollow tube reactor or insert, the processing time generally corresponds to the period of time elapsed from the time of entry of a point on the carbon-containing fiber to the time of exit of the same point on the carbon fiber. The speed at which the carbon-containing material moves through the tube can be suitably adjusted to correspondingly adjust the processing time, which also depends on the length of the tube. The carbon-containing material can be moved through the reactor at a speed of, for example, 0.2, 0.5, 1, 1.5, 2, 3, 4, 5, 6, 7, 8, 9, 10, 11, or 12 inches/min. However, for a scaled-up industrial application, the speed may be as high as, for example, 20, 50, 100, 200, 300, or 400 inches/min.

The ozonation process described above can be practiced with no pretreatment step of the carbon-containing material, i.e., the carbon-containing material is directly treated by the above ozonation process. In other embodiments, the ozonation process described above can be practiced with a pretreatment step of the carbon-containing material. A particular pretreatment step considered herein is one that facilitates the decomposition of ozone during the ozonation process, or that generates hydroxyl groups on the carbon-containing material before it enters the reactor. In particular embodiments, the pretreatment step is a wet process in which carbon-containing material is contacted (i.e., wetted) with an oxidation solution. The oxidation solution contains one or more oxidants, such as a peroxide and/or a mineral acid, preferably a strong mineral acid, in a suitable solvent. The peroxide can be, for example, an inorganic peroxide (e.g., hydrogen peroxide, i.e., $H_2O_2$, or barium peroxide) or an organic peroxide (e.g., benzoyl peroxide, cumene hydroperoxide, or a peroxy acid). The strong mineral acid can be, for example, nitric, hydrochloric, hydrobromic, or hydrosulfuric acid. In some embodiments, the oxidant is an organic acid, such as a carboxylic acid (e.g., formic acid, acetic acid, propanoic acid, oxalic, malonic acid, fumaric acid, or succinic acid) or a sulfonic acid (e.g., methanesulfonic acid or toluenesulfonic acid). Typically, the solvent is water or an aqueous-based solvent mixture, such as a water-alcohol mixture. The oxidant can be in any suitable concentration in the oxidation solution. In different embodiments, the oxidant is in the oxidation solution in a concentration of 0.1, 0.5, 1, 2, 5, 10, 15, 18, 20, 25, 30, 35, 40, 45, 50, 55, or 60 wt %, or in a concentration of 0.5, 1, 2, 3, 4, 5, 6, 7, 8, 9, 10, 11, or 12 molar (M) or normal (N), or a concentration in a range bounded by any two of the foregoing values. The carbon-containing material can be processed in the pretreatment step for any suitable amount of time, such as, for example, less than 1 minute (e.g., 10, 20, 30, or 40 seconds), up to 1 minute, or greater than 1 minute (e.g., 1.5, 2, 3, 4, 5, 10, 15, 20, 30, 40, 50, or 60 minutes).

The above-described ozonation process is a completely gaseous-phase process wherein the carbon-containing object contacts ozone in a flowing gas stream. The ozone and gas stream are in the absence of a liquid phase. A pre-treatment or post-treatment step (i.e., relative to the ozonation step), if included, may be conducted in a gas or liquid. The pretreatment and/or post-treatment process may be, for example, any process known in the art for surface treating carbon or carbon-containing material. Generally, the method described herein for surface treating a carbon-containing material excludes an electrochemical process. By excluding an electrochemical process, the carbon-containing material is not subjected to an electrical current or voltage while immersed in a conductive (i.e., electrolytic) liquid or solution, such as an aqueous caustic, ammonium-containing, hypochlorite, or permanganate solution. In other embodiments, the surface treatment method described herein excludes exposing the carbon-containing object to a source of energetic particles (e.g., electron or neutron beam) or energetic electromagnetic radiation, such as ultraviolet, x-ray, or microwave radiation, during treatment with ozone.

By any of the above-described methods, the resulting processed carbon-containing material has a surface highly enriched in oxygen. Preferably, the processed carbon-containing material has a surface atomic oxygen content of, about, or at least, for example, 15%, 18%, 20%, 22%, 25%, 27%, 30%, 32%, 35%, 38%, or 40%, or a surface atomic oxygen content within a range bounded by any two of the foregoing values. The surface atomic oxygen content of the carbon material can be determined by any suitable elemental analysis technique known in the art, such as x-ray photoelectron spectroscopy (XPS).

In some embodiments, the processed carbon-containing material possesses any of the exemplary surface atomic oxygen contents provided above in a substantially unvarying (i.e., substantially uniform) distribution over the entire surface of the carbon-containing material, e.g., a variation of no more than ±0.5, ±1, ±2% over the surface of the carbon-containing material. In other embodiments, the processed carbon-containing material possesses an average surface atomic oxygen content, over its entire surface, equivalent to any of the exemplary surface atomic oxygen contents provided above. In different embodiments, the variation inherent in an average of the surface atomic oxygen content over the surface of the carbon-containing material may or may not include a surface atomic oxygen content below 15%. In some embodiments, the surface atomic oxygen content over the entire surface of the carbon-containing material is at least or above any of the exemplary surface atomic oxygen values provided above, and the surface atomic oxygen value may or may not vary above this value over the entire surface of the carbon-containing material.

The oxygenated surface in the processed carbon-containing material is attributed to oxygen-containing functional groups. Such functional groups include, for example, hydroxyl (—OH), ether (—OR), carboxyl (—COOH), and aldehydic (—C(O)H) groups. Depending on the application, it may be preferable to increase the presence of certain functional groups and decrease the presence of other functional groups. The instant method can advantageously adjust the surface composition by corresponding adjustment in the conditions of the process (e.g., processing temperature and ozone concentration). For example, particularly if the carbon-containing material is to be subsequently coated with epoxy sizing agent or embedded into an epoxy matrix, the carbon-containing material preferably has epoxy-reactive groups (i.e., hydroxyl and carboxyl groups) in a predominant amount on its surface rather than aldehydic groups. By being in a "predominant amount" is generally meant that surface hydroxyl and carboxyl groups are present in an amount greater than 50%, or at least or above 60%, 65%, 70%, 75%, 80%, 85%, 90%, 95%, 98%, or 100% with respect to the total number of surface groups, and with particular respect to oxygen-containing surface groups. In some embodiments, hydroxyl groups are in a predominant amount relative to carboxyl groups, or carboxyl groups are in a predominant amount relative to hydroxyl groups. In yet other embodiments, aldehydic or other non-hydroxyl or non-carboxylic acid groups are in a predominant amount.

After the carbon-containing material is processed, it may be coated with a sizing agent. As considered herein, and as known in the art, a sizing agent is any substance that adheres or bonds with a carbon-containing material to adjust the mechanical properties of the carbon-containing material or to adjust the interfacial interaction between the carbon-containing material and a polymeric matrix when the carbon-containing material is incorporated into a polymeric matrix. The sizing agent can be any of the sizing agents known in the art, including, for example, an epoxy, saturated or unsaturated polyurethane, saturated or unsaturated polyester, polyacrylate, polymethacrylate, polyacrylonitrile, vinyl ester resin, unsaturated polyester resin, polyol, polyalkylene glycol, polyalkylene glycol ether, bisphenol A ether, or phenol-formaldehyde, and epoxide and glycidyl derivatives thereof, and amine-crosslinked derivatives thereof.

In particular embodiments, the processed carbon-containing material is coated or covalently bound on its surface to an epoxy sizing agent. The epoxy sizing agent can be made to covalently bond to the surface of the carbon-containing material by reacting its epoxy groups with epoxy-reactive groups on the carbon-containing material surface. Generally, the epoxy sizing agent being bound to the surface of the carbon-containing material possesses at least two epoxy groups, and thus, can be a difunctional, trifunctional, tetrafunctional, or a higher functional epoxy resin. In many embodiments, the epoxy group is present as a glycidyl group. Such epoxy sizing agents are well known in the art. Some particular examples of difunctional epoxy resins include diglycidyl ethers of a diol (i.e., glycol), wherein some examples of diols include ethylene glycol, diethylene glycol, triethylene glycol, propylene glycol, 1,3-propanediol, 1,4-butanediol, 1,5-pentanediol, 1,6-hexanediol, tetraethylene glycol, pentaethylene glycol, bisphenol A, bisphenol AF, bisphenol S, neopentyl glycol, 2,2,4,4-tetramethyl-1,3-cyclobutanediol, catechol, resorcinol, dihydroxyquinone, thiodiglycol, and 4,4'-dihydroxybiphenyl, as well as epoxy prepolymer resins of the following general formula (where m can be 0, 1, 2, 3, 4, 5, 10, or a number up to, for example, 20, 25, 30, 40, or 50):

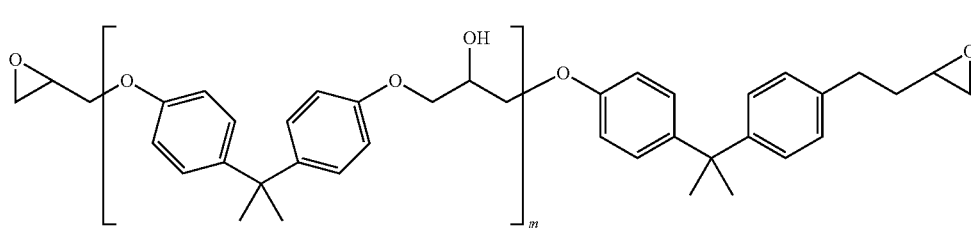

(1)

Some particular examples of trifunctional and tetrafunctional epoxy resins include triglycidyl and tetraglycidyl ethers of a triol or tetrol, respectively, wherein some examples of triols include glycerol, 1,3,5-trihydroxybenzene (phloroglucinol), trimethylolethane, trimethylolpropane, triethanolamine, and 1,3,5-triazine-2,4,6-triol (cyanuric acid). An example of a tetrol is pentaerythritol.

The difunctional, trifunctional, tetrafunctional, or higher functional epoxy resin can also be, for example, a diglycidyl, triglycidyl, tetraglycidyl, or higher polyglycidyl ether of a phenol novolak resin or bisphenol A novolak resin. Such resins are well-known in the art, as described, for example, in U.S. Pat. No. 6,013,730, which is herein incorporated by reference in its entirety.

The epoxy sizing agent on the carbon-containing material is often cured. The curing agent for the epoxy resin can be any of the curing agents known in the art for this purpose. Typically, the curing agent is a polyamine, such as a diamine, triamine, tetramine, or higher polyamine, such as an amine-containing polymer, wherein it is understood that the polyamine contains at least two amino groups selected from primary, secondary, and tertiary amines. The polyamine can be conveniently expressed as R—$(NH_2)_n$, wherein R and n are as defined above in Formula (1), and one or two hydrogen atoms of the amino group may be replaced with a linker R or a hydrocarbon group (a protonated form of any of the linking groups R), which may itself also contain a primary, secondary, or tertiary amine group. Some examples of polyamine curing agents include ethylene diamine (EDA), diethylenetriamine (DETA), triethylenetetramine (TETA), tetraethylenepentamine (TEPA), piperazine, guanidine, 2-cyanoguanidine (dicyandiamide), aromatic amines (e.g., diaminobenzene, methylenedianiline, and 3,3'- and 4,4'-diaminodiphenylsulfones), polyethylene glycol-based polyamines (e.g., triethylene glycol diamine or tetraethylene glycol diamine, or as provided by the commercially available polyetheramine JEF-FAMINE® series of compositions), m-phenylenediamine, imidazole, 2-methylimidazole, diethylaminopropylamine, isophoronediamine, m-xylenediamine, as well as their N-alkyl (e.g., N-methyl or N-ethyl) analogs, provided that at least two amino groups selected from primary and secondary amines are provided in the curing agent.

In another aspect, the invention is directed to a solid composite in which the surface-treated carbon material, described above, which may or may not be coated with a sizing agent, is embedded (i.e., incorporated) within a polymeric matrix. The polymer of the matrix can be any polymer suitable for use in a high strength application. The matrix polymer can be a thermoplastic or thermoset. Any of the polymer systems considered above for the sizing agent can also be considered herein as the polymeric matrix. In some embodiments, the matrix polymer is selected from any of the condensation polymers known in the art. The condensation polymer can be, for example, a polyester, polyamide, polyurethane, or phenol-formaldehyde, or a copolymer thereof, or a copolymer with any of the addition polymers described above. In many embodiments, the polymeric matrix is an epoxy-based system, such as any of the epoxy-based systems described above for the sizing agent and as well-known in the art for use in a variety of applications.

A particular class of matrix polymers considered herein are those resulting from vinyl-addition polymerization of an unsaturated precursor resin or unsaturated monomers. By being unsaturated, the precursor resin or monomer contains carbon-carbon double bonds. The polymeric matrix can be derived from, for example, curing any of the acrylate or methacrylate monomers known in the art (e.g., acrylic acid, methacrylic acid, methylmethacrylate, hydroxyethyl-methacrylate), acrylonitrile, ethylene, propylene, styrene, divinylbenzene, 1,3-butadiene, cyclopentene, vinyl acetate, vinyl chloride, or a cycloolefin (e.g., cyclohexene, cycloheptene, cyclooctene, or norbornene), or a fluorinated unsaturated monomer, such as vinylidene fluoride, fluoroethylene, or tetrafluoroethylene. The polymeric matrix can be a homopolymer, or alternatively, a copolymer, e.g., block, random, alternating, or graft copolymer of two or more different types of monomers, such as any of those mentioned above.

In a first particular embodiment, the matrix polymer is derived from a vinyl ester resin by curing methods well-known in the art. Vinyl ester resins are known to possess terminal carbon-carbon double bonds. As known in the art, a vinyl ester resin is generally formed by reaction between a diepoxide, triepoxide, or higher polyepoxide (e.g., as described above under Formulas 1, 1a, and 2) and an unsaturated monocarboxylic acid, such as acrylic or methacrylic acid. The general process for producing an exemplary difunctional divinyl ester is provided as follows:

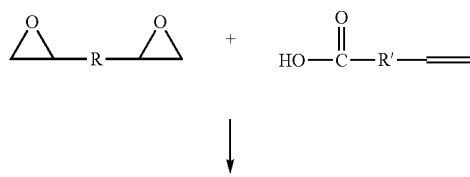

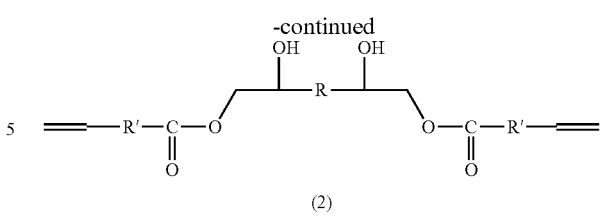

(2)

In the above scheme, Formula (2) depicts an exemplary set of difunctional divinyl esters in which R is as defined above and R' is either a bond or a hydrocarbon linker R, as defined above. In particular embodiments, the diepoxy molecule depicted in the above scheme is bisphenol A diglycidyl ether (DGEBA).

In a second particular embodiment, the matrix polymer is derived from an unsaturated polyester resin. Unsaturated polyester resins are known to possess internal carbon-carbon double bonds. As known in the art, an unsaturated polyester resin is generally formed by reaction between a diol, triol, tetrol, or higher polyol, such as any of the polyols described above, and an unsaturated di- or tri-carboxylic acid, such as maleic, phthalic, isophthalic, or terephthalic acid. The general process for producing an exemplary unsaturated polyester resin is provided as follows:

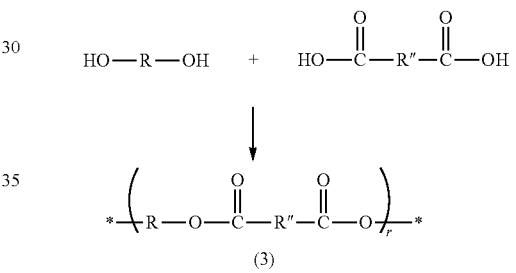

In the above scheme, Formula (3) depicts an exemplary set of unsaturated polyester resins in which R is as defined above and R" is an unsaturated hydrocarbon linker containing a reactive alkenyl group, such as any of the unsaturated hydrocarbon linkers defined for R above containing this feature, and r is generally at least 1, 2, 3, 4, or 5, and up to 6, 7, 8, 9, 10, 12, 15, 18, or 20 (or any range bounded by any two of these values). The diol HO—R—OH shown in the above scheme may be replaced with or combined with a triol, tetrol, or higher functional alcohol, or generically defined as R—(OH)$_n$ where n is as above except that it is a minimum of 2, and the dicarboxy molecule depicted in the above scheme can be replaced with or combined with a tricarboxy or higher carboxy molecule. In particular embodiments, the polyol is selected from a polyethylene glycol, such as ethylene glycol, diethylene glycol, and triethylene glycol, and the polycarboxy is selected from maleic acid, phthalic acid, isophthalic acid, and terephthalic acid.

In one embodiment, the sizing agent on the carbon-containing material is not covalently bonded with the matrix polymer, although the sizing agent typically forms an interpenetrating network with the matrix polymer. In another embodiment, carbon-containing material, or a portion thereof, is covalently bonded with the matrix polymer by covalent bonding between the sizing agent and the polymer matrix, or between oxygen-containing groups on the carbon-containing material surface and the polymer matrix.

In a first embodiment, a covalent bond between the carbon-containing material and polymeric matrix is established by incorporating reactive groups in the sizing agent that react with the matrix precursor resin when carbon-containing material and matrix precursor resin are combined. For example, epoxy-functionalized carbon-containing material can be reacted with a difunctional molecule that contains an epoxy-reactive group, for reacting with the sizing agent, as well as an unsaturated group, for reacting (typically, but by no means solely, via vinyl-addition coupling) with the matrix precursor resin. The epoxy-reactive end of the difunctional molecule becomes bound to the epoxy sizing bonded with the carbon-containing material, and the unsaturated portion of the difunctional molecule is free and available for reaction with the matrix precursor resin. In particular embodiments, the difunctional molecule is an alkenyl amine, such as allylamine (2-propen-1-amine), 3-buten-1-amine, or 4-penten-1-amine, or an alkenyl alcohol, such as allyl alcohol (2-propen-1-ol), 3-buten-1-ol, 4-penten-1-ol, or 4-hydroxystyrene.

In a second embodiment, a covalent bond between carbon-containing material and polymeric matrix is established by incorporating reactive groups in the matrix precursor resin that react with the sizing agent on the carbon-containing material when carbon-containing material and matrix precursor resin are combined. For example, an unsaturated difunctional monomer can be included in the matrix precursor resin that will cure with components of the matrix precursor resin via its unsaturated end, and also covalently bond with the epoxy sizing agent on the carbon-containing material via its epoxy-reactive end. The unsaturated difunctional monomer can be, for example, an amino-containing acrylate or methacrylate, such as 2-aminoethyl methacrylate, 2-(methylamino)ethylmethacrylate, 2-(dimethylamino)-ethylmethacrylate, or any of the alkenyl amine or alkenyl alcohol difunctional molecules described above.

In particular embodiments, the ozone-processed carbon-containing material is contacted with the sizing agent under conditions, as known in the art, that permit a covalent bond to be formed between an epoxy sizing agent and reactive groups on the carbon-containing material surface. In a specific embodiment, the carbon-containing material is contacted with a solution or emulsion of the sizing agent, wherein the solution or emulsion of the sizing agent includes the sizing agent dispersed in a solvent carrier, e.g., water, a water-soluble solvent (e.g., acetone or methylethylketone), or other polar or non-polar solvent, or a combination thereof or aqueous solution thereof. The sizing agent can be admixed with solvent carrier in any desired concentration, but typically in an amount no more than 30% by weight of the total of sizing agent and solvent carrier, such as 1%, 2%, 5%, 10%, 15%, 20%, or 25% by weight. In particular embodiments, the sizing agent is included in the carrier solution in a concentration of up to or less than 10%, and more preferably, from 1 to 5%, 1 to 4%, 1 to 3%, or 1 to 2%. Generally, a room temperature condition (i.e., from 15-25° C., or about 20° C.) is acceptable, but an elevated temperature may also be used to facilitate bonding. An intermediate processing step, before curing, may also be included, such as a rinsing, drying, or annealing step. The epoxy sizing agent on the carbon-containing material is then cured by methods well-known in the art. A post-processing step, after curing, may also be included, such as a rinsing, drying, or annealing step.

In another aspect, the invention is directed to a process for preparing the composite of carbon-containing material embedded in a polymer matrix described above. In the method, ozone-processed carbon-containing material with or without sizing agent are mixed with matrix precursor resin before subjecting the mixture to a curing process. The matrix precursor resin can be any of the precursor resins described above.

Particularly in the case of unsaturated precursor matrix resin, it is commonplace to also include an unsaturated reactive diluent as a matrix component prior to curing. The unsaturated reactive diluent typically serves to crosslink portions of the precursor resin and facilitate interdiffusion between the sizing and polymer matrix, which provides a stonger and harder matrix. In specific embodiments, the unsaturated reactive diluent is a molecule containing one, two, or three vinyl groups. Some examples of unsaturated reactive diluents include styrene, divinylbenzene, a methacrylate, an acrylate, a vinyl ester (e.g., vinyl acetate), or a vinyl ester resin.

The conditions used in curing such precursor resins are well known in the art, and may rely on, for example, an elevated temperature, radiative exposure (e.g., UV, microwave, or electron beam), or both, as well as the use of an initiator, such as a peroxide (e.g., cumene hydroperoxide, butanone peroxide, t-butylperoxybenzoate, benzoyl peroxide, or MEKP) or Lewis acid (eg., $BF_3$), and if applicable, a catalyst, such as a metal-containing catalyst, e.g., a ROMP catalyst. In particular embodiments, the curing step is conducted at a temperature selected from 125° C., 130° C., 135° C., 140° C., 145° C., 150° C., 155° C., 160° C., 165° C., 170° C., 175° C., 180° C., or 185° C., or a temperature within a range bounded by any two of these values, for a curing time selected from 0.5, 1.0, 1.5, 2.0, 2.5, or 3.0 hours, or a time within a range bounded by any two of these values, wherein it is understood that higher curing temperatures generally require shorter curing times to achieve the same effect. In some embodiments, a two-step or three-step curing process is used, wherein each step employs a different temperature.

In yet another aspect, the invention is directed to a method of reducing the diameter of a carbon fiber or thickness of a carbon film or other carbon material by using the ozonation method described above. As the ozonation process described above has herein been found to remove a surface portion of carbon (i.e., one or more weakly bonded graphene planes) while at the same time oxygenating the carbon surface, the above-described ozonation process can be used for reducing the diameter of a carbon fiber. In embodiments where a substantially reduced diameter or thickness is desired for the carbon material, the carbon material can be subjected to the ozonation process for a period of time significantly longer than required for endowing the carbon surface with a sufficient or desired level of surface oxygenation, or the ozonation process may be repeated once, twice, thrice, or more times, as sufficient, for achieving a desired diameter or thickness.

The processed carbon fiber may also be post-processed in ways other than or prior to coating with a sizing agent or incorporation into a polymeric matrix. For example, the processed carbon fiber may be subjected to a graphitization process, or subjected to a doping process wherein a dopant, such as nitrogen, boron, phosphorus, sulfur, or fluorine is doped into the carbon fiber. A graphitization or doping process may also be used in a pre-processing step. Graphitization and carbon dopant processes are well known in the art.

Examples have been set forth below for the purpose of illustration and to describe certain specific embodiments of the invention. However, the scope of this invention is not to be in any way limited by the examples set forth herein.

Example 1

Processing of Carbon Fiber

Experiment A

In this experiment, the carbon fiber was in the form of a 50,000 filament tow. Carbon fibers were drawn continuously through a heated Pyrex® glass circular tubular reactor having an internal diameter (ID) of 1.5 inches (1.5") and a length of 60 inches (total reactor volume of 105.98 cubic inches). Approximately 9 wt % ozone gas was supplied from the middle top of the tube. The residence time for the carbon fiber in the reactor was about 90 seconds. The flow rate of the carrier gas was set at 2 lt/min (122.04 cubic inches/min). Thus, the approximate reactor renewal time was 0.868 minutes. A general schematic of the apparatus and process is shown in FIG. 1.

Figure 2:
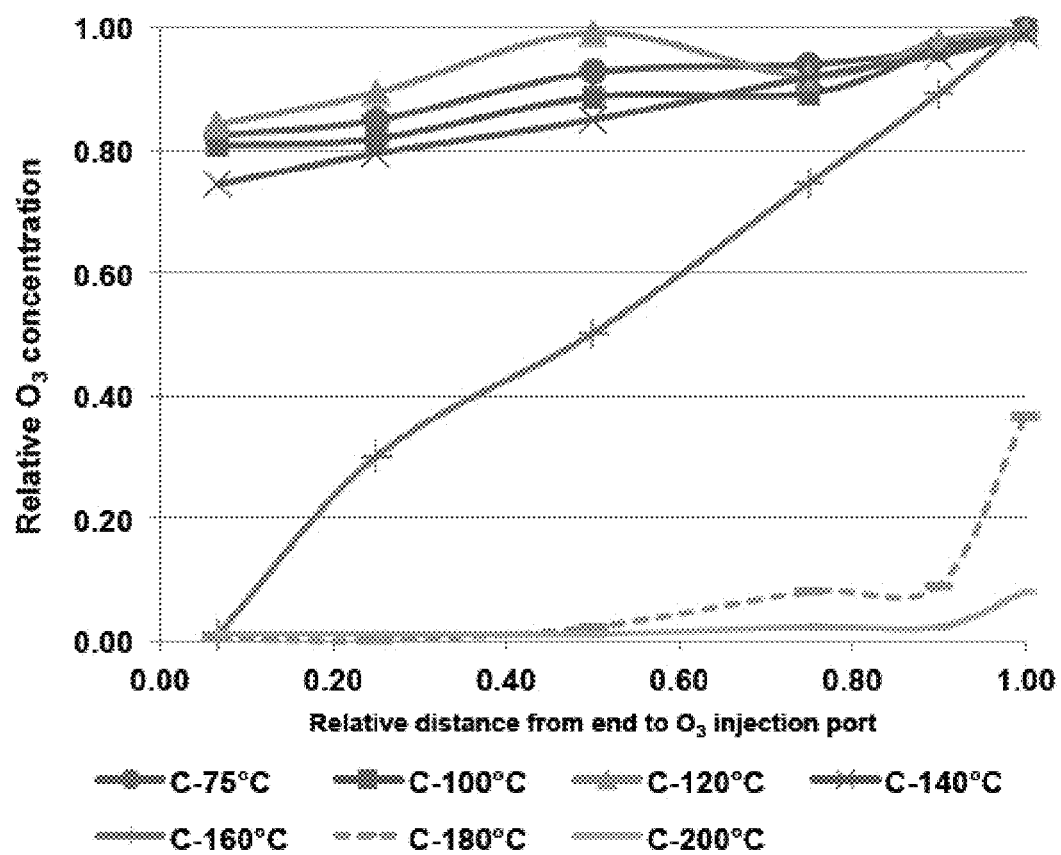
FIG. 2. Chart showing measured real time ozone concentration along half the length of a 1.5" diameter glass tubular reactor, using 9 wt % ozone provided at a flow rate of 2 lt/min. The x-axis is normalized to half length (L/2) of surface treatment applicator.

Using the above system, ozone decomposition kinetics and distribution were analyzed by varying the processing temperature. FIG. 2 is a chart plotting observed relative ozone concentration to relative distance from the ozone injection port. A relative distance of 1.00 is taken as the location of the ozone injection port, and a position of 0.00 is taken as an end of the tube farthest from the ozone injection port. As shown by FIG. 2, temperatures less than 140° C. provide undesired thermokinetic degradation of ozone when using the particular conditions of the system under study. Specifically, under 140° C., the ozone decomposition rate is very low, i.e., at most about 20% using the particular conditions of the system under study. This resulted in a poor surface treatment of less than 10% atomic oxygen content as evidenced by X-Ray Photoelectron Spectroscopy (XPS) data. As also shown by FIG. 2, at a processing temperature of 160° C., ozone decomposed effectively along the length of the reactor, which provided a high surface atomic oxygen of about 20%. As further shown by FIG. 2, at processing temperatures over 160° C., the ozone decomposition rate became significantly faster and ozone concentration was not distributed as evenly along the length of the reactor. Thus, processing temperatures above 160° C. were also found to be non-optimal using the particular conditions of the system under study.

Experiment B

The dimensions of the reactor and materials used in the reactor also have a significant effect on the kinetics and distribution of ozone decomposition. This example employed a metal 5" by 5" reactor in the tubular reactor of 60" length as fibers moved through the center portion of the reactor. Ozone and air densities were 2.14 kg/m³ and 1.29 kg/m³, respectively. Due to the heavy nature of ozone molecules, they tend to accumulate at the bottom of the reactor. Although the proper balance of ozone decomposition may be achieved, the generated active species may not react with the carbon fiber effectively if most of the reaction is occurring below the area where the fibers move. This results in poor surface treatment.

Regarding the dimensions of the reactor, a reduced interaction between carbon fiber surfaces and ozone was observed in larger diameter tubes, particularly those having a diameter greater than three inches. More optimal results were observed using a circular glass tube reactor having a diameter of three inches. Using a diameter less than three inches was found to be disadvantageous in some cases because of the difficulty in controlling temperature in the reactor due to the exothermic nature of the ozone thermal degradation reaction. When hot spots occur in the reactor, ozone will decompose very rapidly, which makes surface treatment much less effective. Thus, using a tubular reactor of less than 3" ID for the reactor was found to be effective under a limited range of surface treatment conditions. Metal inside the reactor was also found to have a negative effect on the efficiency as compared to ceramic or glass inserts with the same geometry and size. This is attributed to the formation of oxides on surfaces of such metals in the reactor, as well as faster decomposition of ozone by its interaction with metal surface.

Experiment C

In this experiment, carbon fiber was in the form of a 50,000 filament tow. Carbon fibers were drawn continuously through a heated Pyrex® glass circular tubular reactor having an internal diameter (ID) of 3 inches (3") and a length of 120 inches. Approximately 7 wt % ozone gas was supplied from both the bottom and the top every 24" along the length of the reactor (8 individual ozone supply injection ports). The residence time for the carbon fiber in the reactor was about 90 seconds. The overall flow rate of the carrier gas was set at 10 lt/min, distributed equally among the 8 injection ports. This equated to a reactor renewal rate of 1.39 minutes. A uniform 160° C. temperature profile was maintained during the experiment. The apparatus and process is similar to that depicted in FIG. 1, except where indicated.

The atomic composition of the surface of the processed fibers, as measured by XPS, is shown in Table 1 below:

TABLE 1

Atomic composition of the surface of processed carbon fibers

|  | % C | % O | % N |
|---|---|---|---|
| Untreated fibers | 98 | 2 | <1 |
| Electrochemical oxidation process of the art | 88 | 7 | 5 |
| Ozonation process herein described | 73 | 20 | 3 |

As shown in Table 1, the instant ozonation process achieves a remarkably higher level of surface oxygenation than possible using electrochemical oxidation processes of the art.

The relative area of each component in the fitting of C(1s), O(1s) and N(1s) peaks, in percentage of the total area of the peak, is shown in Table 2 below:

TABLE 2

Relative area of each component in the fitting of C(1s), O(1s) and N(1s) peaks, in percentage of the total area of the peak

| | $C_{1S}$ | | | | | | | $O_{1S}$ | | |
|---|---|---|---|---|---|---|---|---|---|---|
| | | | | | C—O—R | | | | | |
| | C=C | C—C | C—COOR | C—N | C≡N | C=O | COOH | Ph=O, Ph—C=O | C=O | R—OH, C—O—C |
| Untreated | 87 | 10 | 0 | 0 | 2 | 1 | 0 | 27 | 30 | 21 |
| Electrochemical | 82 | 2 | 2 | 6 | 3 | 3 | 2 | 27 | 12 | 44 |

TABLE 2-continued

Relative area of each component in the fitting of C(1s), O(1s) and N(1s) peaks, in percentage of the total area of the peak

| Thermo-chemical | 76 | 2 | 6 | 2 | 5 | 3 | 6 | 20 | 24 | 14 |

| | $O_{1S}$ | | | $N_{1S}$ | | | |
|---|---|---|---|---|---|---|---|
| | Ph—OH C—O | $H_2O$, Chem | $H_2O$, Phys | Pyridine Amines | Amides Nitriles | Pyrrolidine, Pyridone | Pyridinium, Protonated N |
| Untreated | 18 | 3 | 1 | 11 | 3 | 34 | 52 |
| Electro-chemical | 32 | 5 | 5 | 14 | 32 | 28 | 26 |
| Thermo-chemical | 34 | 4 | 4 | 25 | 8 | 30 | 37 |

Figure 3:
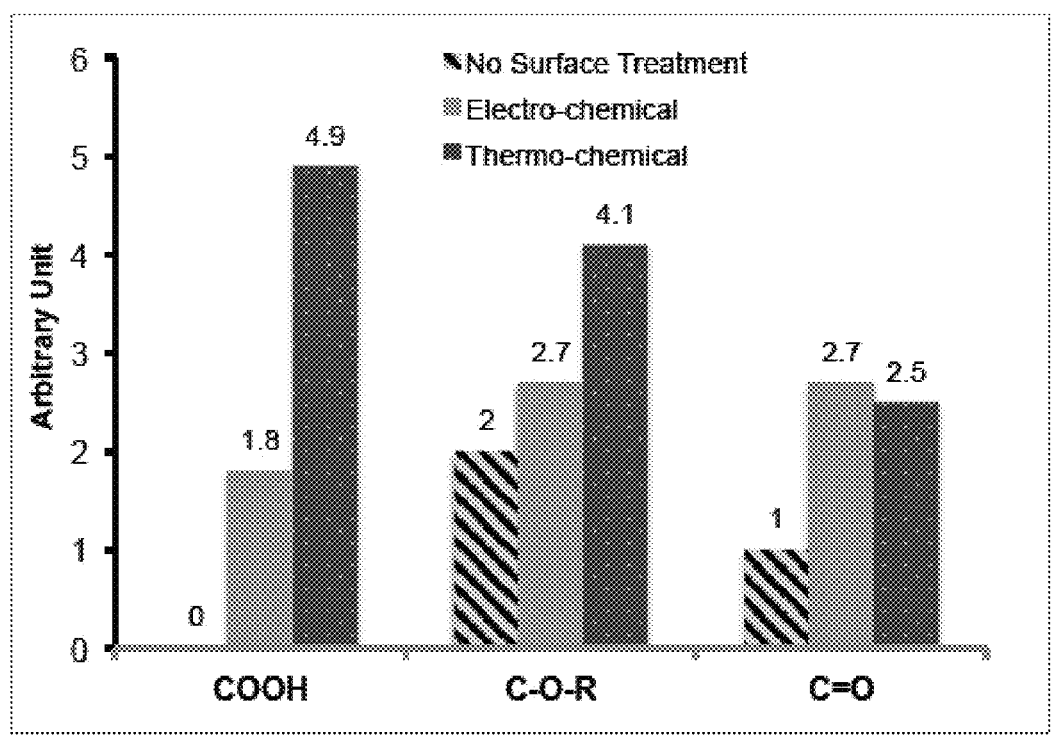
FIG. 3. Chart comparing relative densities of functional groups on the surface of untreated and surface-treated fibers provided by an electrochemical treatment of the art and the ozonation (thermo-chemical) treatment described herein.

FIG. 3 is a bar chart comparing the relative densities of functional groups at the surface of non-treated and surface-treated carbon fibers. Significantly, as shown by FIG. 3, electrochemical processes of the art tend to produce non-reactive carbonyl species (e.g., aldehydic or ketonic groups) on the carbon surface in a predominant amount with carboxylic acid groups in a minor amount, whereas the instantly described method (i.e., "thermo-chemical" designation) produces carboxylic acid groups in a predominant amount, with non-reactive carbonyl species in a minor amount. A predominant amount of carboxylic acid and/or hydroxyl groups is particularly advantageous when the carbon fibers are to be incorporated into a polymeric matrix that contains groups reactive to carboxylic acid and/or hydroxyl groups (e.g., an epoxy matrix).

In FIG. 3, the C—O—R component peak used in the fitting of the C1s peak (XPS analysis) includes all of the functionalities that can be a C—O—C or a C—O—H structure, with the carbon atoms linked to other carbon atoms. The signal includes hydroxyl groups linked to a carbon-based backbone structure (i.e., phenol or alcohol) or C—O—C type structures, such as ether and epoxide groups. Significantly, the fitting of the O1s peaks indicates that in the case of the thermochemical surface treatment described herein, the majority of the C—O—R component is attributed to phenol functionalities, whereas in the case of the electrochemical surface treatment of the art, the majority or a significantly higher proportion of the C—O—R component is attributed to ether and epoxide groups that are less reactive or substantially unreactive.

Since the size of the tow was large (50K), a separate study was undertaken to assess the homogeneity of the surface treatment. The tow was separated in the middle in two equal half tows and the surface that was originally in the center of the tow was analyzed by XPS. The results of the study are shown in Table 3 below.

Table 3. Elemental analysis of central and external portions of carbon fiber tow processed by the ozonation process described herein.

| | % C | % O | % N |
|---|---|---|---|
| External part of the tow | 73 | 20 | 3 |
| Center of the tow | 73 | 20 | 3 |

As shown in Table 3, the fitting of the C(1s), O(1s) and N(1s) peaks show that the surface chemistry generated at the center of the tow is equivalent to that created at the external part. In particular, as shown by the results of Table 3, above, the concentration of oxygen in the center of the tow was found to be the same as the concentration corresponding to single fibers located at the external part of the tow. Moreover, an XPS analysis was also conducted on several samples separated by a few meters in the spool. From this, it was found that the treatment was consistent, with a concentration of oxygen remaining relatively stable with an atomic concentration of 19-20%.

Example 2

Hybrid Surface Treatment of Carbon Fibers

Figure 4:
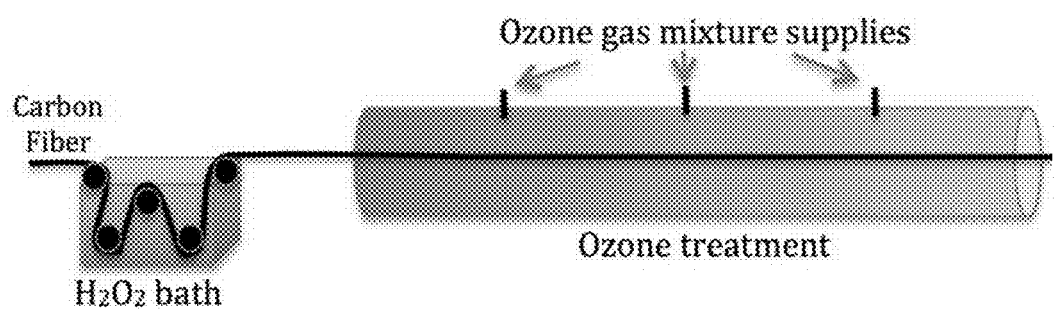
FIG. 4. General schematic showing an exemplary apparatus and process for a hybrid surface treatment process in which carbon-containing fiber is pretreated in a wet chemical bath containing peroxide before being treated in the ozonation process of the instant invention.

In this experiment, a pre-treatment wet chemical step of exposing carbon fibers to an oxidant solution (e.g., of hydroxyl or nitrate radicals) was employed prior to gas-phase thermal ozone treatment. The pre-treatment step was employed to either catalyze the decomposition of ozone or generate hydroxyl oxidation to reduce the residence time and/or enhance the functionality on the carbon fiber surface. FIG. 4 depicts the general principles of the process using hydrogen peroxide ($H_2O_2$) as an oxidant. A 30 wt % $H_2O_2$ solution in water was used for the pretreatment step. The solution apparently also included traces of Ca, Na, and Fe, since these were also detected on the carbon fiber surface by XPS.

Using the above hybrid method, the ozone decomposition rate was found to increase in regions close to the carbon fiber surface, which improved the oxidation of carbon fibers. Thus, pretreatment with peroxide was found to permit a reduction in the ozone concentration in the supplied gas and/or reduction in the temperature profile of the reactor with a similar final level of generated oxygen-containing groups on the surface of the fibers. In particular, wetting with peroxide prior to ozone treatment was found to increase the concentration of hydroxyl free radicals on the carbon fiber surface. The high level of hydroxyl functionality is particularly desired when the carbon fibers are to be coated with or incorporated in an epoxy or unsaturated matrix. The surface elemental analysis results of some typical experiments are shown in Table 4 below:

TABLE 4

X-Ray photoelectron spectroscopy results for carbon fibers pretreated with peroxide before ozone treatment.

| | Process conditions | | Average | | | | | | |
|---|---|---|---|---|---|---|---|---|---|
| | $O_3$ | Temp (° C.) | C | O | N | Ca | Na | Si | F |
| Sample 1 | 6.5 | Room Temperature | 73 | 18 | 3 | 4 | 0 | 1 | 1 |
| Sample 6 | 5.7 | 120 | 63 | 24 | 6 | 5 | 1 | 1 | 0 |
| Sample 7 | 5.7 | 140 | 65 | 24 | 3 | 3 | 2 | 3 | 0 |
| Sample 9 | 5.7 | 160 | | 25 | 3 | 2 | 2 | 2 | |
| Sample 10 | 5.7 | 180 | 60 | 26 | 6 | 5 | 1 | 2 | 0 |

Significantly, the surface functionality can be modified in different ways using other oxidant solutions in place of peroxide, such as nitric acid ($HNO_3$) and hydrochloric acid (HCl).

Example 3

Preparation of a Solid Composite of Treated Carbon Fibers in a Polymer Matrix

The shear strength between carbon fiber and matrix was evaluated using short beam shear (ASTM 2344) and transverse flexural test (ASTM 790-92) methods. Tested shear properties of composites containing carbon fibers before and after the instant ozonation treatment process are given in Table 5, below, for both vinyl ester resin matrix and epoxy resin matrix. Significant shear strength improvement was observed after the ozonation surface treatment described herein.

TABLE 5

Flexural properties of vinyl ester and epoxy composites.

| | Carbon Fiber-Vinyl Ester Resin Composite | | Carbon Fiber-Epoxy Resin Composite | |
|---|---|---|---|---|
| | No surface treatment, with Derakane ® 782 (commercial vinyl ester resin) as precursor to cured matrix | Instant thermochemical surface treatment with Derakane ® 782 as precursor to cured matrix | No surface treatment, with Epon ® 828 (commercial epoxy resin) + Epikure ® W (commercial aromatic amine curing agent) as precursors to cured matrix | Instant thermochemical surface treatment, with Epon ® 828 + Epikure ® W as precursors of epoxy matrix |
| Flex 90 deg strength MPa | 12 ± 2 | 26 ± 4 | 34 ± 3 | 77 ± 7 |
| Flex 90 deg modulus (GPa) | 5.9 ± 0.1 | 5.9 ± 0.1 | .3 ± 0.1 | 7.4 ± 0.1 |
| Flex 0 deg strength (MPa) | 1188 ± 109 | 1139 ± 98 | 981 ± 102 | 1097 ± 44 |
| Flex 0 deg modulus (MPa) | 117.6 ± 1.6 | 116.9 ± 2.6 | 97.2 ± 1.7 | 94.7 ± 2.2 |
| ILSS (MPa) | 57 ± 3 | 69 ± 4 | 52 ± 3 | 74 ± 2 |
| | 59 ± 2 | 68 ± 3 | 51 ± 3 | 72 ± 4 |

While there have been shown and described what are at present considered the preferred embodiments of the invention, those skilled in the art may make various changes and modifications which remain within the scope of the invention defined by the appended claims.

What is claimed is:

1. A method for surface treating a carbon-containing material, the method comprising reacting said carbon-containing material with decomposing ozone by passing said carbon-containing material through a hollow tube containing a flowing gas stream comprised of ozone under conditions, including a processing temperature of about 160° C., where said ozone decomposes after being introduced into said hollow tube by at least one ozone inlet, wherein a concentration gradient of said ozone decreasing from said ozone inlet to an ozone outlet having near zero concentration of ozone is established throughout said hollow tube by appropriate selection of at least processing temperature, gas stream flow rate, tube diameter, tube length, ozone concentration entering said hollow tube, and position of said ozone inlet in said hollow tube; wherein said method produces a surface-oxidized carbon-containing material.

2. The method of claim 1, wherein said carbon-containing material is selected from carbon fiber, carbon whisker, carbon fiber tow, a woven or non-woven mat of carbon fiber, carbon block, carbon film, and carbon particles.

3. The method of claim 1, wherein said hollow tube has at least an interior portion that is non-metallic.

4. The method of claim 3, wherein at least said interior portion is ceramic or glass.

5. The method of claim 1, wherein said hollow tube has an internal diameter of at least 2.5 inches.

6. The method of claim 1, further comprising a pretreatment step of said carbon-containing material wherein said carbon-containing material is contacted with a solution of an oxidant prior to said surface treatment with ozone.

7. The method of claim 6, wherein said oxidant is comprised of a peroxide.

8. The method of claim 7, wherein said peroxide is in a concentration in said solution of 0.1 wt % to 60 wt %.

9. The method of claim 6, wherein said oxidant is comprised of a mineral or organic acid.

10. The method of claim 1, wherein said method is a continuous process in which said carbon-containing material is continuously processed by passing said carbon-containing material through the length of said hollow tube during said method.

11. The method of claim 1, wherein said method is a continuous process in which said carbon-containing material is in the form of a tow of carbon fiber that is continuously processed by passing said tow through the length of said hollow tube during said method.

12. The method of claim 11, wherein said tow is held in a creel, from which the tow is pulled and fed into said hollow tube to be continuously processed.

13. The method of claim 1, wherein said ozone concentration entering said hollow tube is in a concentration of 0.1 to 12 wt % in a carrier gas.

14. The method of claim 1, wherein said carbon-containing material is contacted with said gas stream comprised of decomposing ozone for 1 second to 30 minutes.

15. The method of claim 1, wherein the method produces a carbon fiber with a reduced diameter.

16. The method of claim 1, wherein said method produces a surface-oxidized carbon-containing material having a surface atomic oxygen content of at least 15%, wherein said surface atomic oxygen content is substantially uniformly distributed over the surface of said object.

* * * * *